(12) United States Patent
Kim

(10) Patent No.: US 9,058,871 B2
(45) Date of Patent: Jun. 16, 2015

(54) RESISTIVE RANDOM ACCESS MEMORY(RERAM) DEVICE

(75) Inventor: Kwang Seok Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 411 days.

(21) Appl. No.: 13/615,511

(22) Filed: Sep. 13, 2012

(65) Prior Publication Data

US 2013/0235647 A1     Sep. 12, 2013

(30) Foreign Application Priority Data

Jul. 12, 2012    (KR) .................. 10-2012-0076222

(51) Int. Cl.
*G11C 11/00* (2006.01)
*G11C 13/00* (2006.01)

(52) U.S. Cl.
CPC ...... *G11C 13/0004* (2013.01); *G11C 2207/063* (2013.01); *G11C 13/0007* (2013.01); *G11C 13/004* (2013.01); *G11C 2213/79* (2013.01)

(58) Field of Classification Search
USPC ............. 365/46, 94, 100, 129, 148, 158, 163; 257/2–5, 9, 295, 310, E21.35; 438/95, 438/96, 135, 166, 240, 365, 482, 486, 597, 438/785

See application file for complete search history.

(56) References Cited

U.S. PATENT DOCUMENTS

| 7,778,065 | B2 | 8/2010 | Lamorey et al. |
| 8,014,219 | B2* | 9/2011 | Ueda ................. 365/189.15 |
| 8,040,718 | B2* | 10/2011 | Ueda ..................... 365/158 |
| 8,189,363 | B2* | 5/2012 | Tsuchida et al. ........... 365/148 |
| 8,228,710 | B2* | 7/2012 | Tsuchida ................. 365/148 |
| 2010/0046274 | A1* | 2/2010 | Tsuchida et al. ........... 365/148 |
| 2010/0054020 | A1* | 3/2010 | Ueda ..................... 365/148 |
| 2010/0073992 | A1* | 3/2010 | Ueda ..................... 365/148 |
| 2010/0128552 | A1 | 5/2010 | Kang |
| 2010/0238707 | A1* | 9/2010 | Tsuchida ................. 365/148 |

* cited by examiner

*Primary Examiner* — Harry W Byrne

(57) ABSTRACT

The resistive random access memory (ReRAM) device includes a first amplifier configured to amplify a sensing current corresponding to data sensed in a memory cell, and a second amplifier configured to store the sensing current amplified by the first amplifier, and amplify electric charges when storing the amplified sensing current.

16 Claims, 6 Drawing Sheets

RESISTIVE RANDOM ACCESS MEMORY(RERAM) DEVICE

CROSS-REFERENCE TO RELATED APPLICATION

The priority of Korean patent application No. 10-2012-0076222 filed on Jul. 12, 2012, the disclosure of which is hereby incorporated in its entirety by reference, is claimed.

BACKGROUND OF THE INVENTION

Embodiments of the present invention relate to a Resistive Random Access Memory (ReRAM) device, and more particularly to a ReRAM technology using a Resistive Switch Device (RSD).

Memory devices can be classified into a volatile memory device and a non-volatile memory device. The non-volatile memory device includes a non-volatile memory cell capable of preserving stored data even when not powered. For example, the non-volatile memory device may be implemented as a flash random access memory (flash RAM), a phase change random access memory (PCRAM), a ReRAM, or the like.

The PCRAM includes a memory cell that is implemented using a phase change material such as germanium antimony tellurium (GST), wherein the GST changes between a crystalline phase and an amorphous phase depending on whether heat is applied to the GST, to thereby perform a data storing operation.

A non-volatile memory device (e.g., a magnetic memory, a phase change memory (PCM), or the like) has a data processing speed similar to that of a volatile RAM device. The non-volatile memory device also preserves data even when power is turned off.

ReRAM is a non-volatile memory device and has a thin film whose electric resistance varies depending on an external voltage applied to the thin film. The resistance difference is used in on/off operations.

FIG. 1 is a cross-sectional view illustrating a resistive switch device (RSD) for use in a conventional ReRAM, and FIG. 2 illustrates principles of operations of the RSD.

Referring to FIGS. 1 and 2, an RSD includes a resistive switch 11 between a top electrode 10 and a bottom electrode 12. In this case, the top electrode 10 and the bottom electrode 12 are each formed of metal materials such as platinum (Pt), and the resistive switch 11 may be formed of a resistive insulation layer such as titanium oxide.

The ReRAM having the above-mentioned configuration has been intensively studied since the 1960s. Generally, the ReRAM (MEMRISTOR) has a Metal-Insulator-Metal (MIM) structure that includes a transition metal oxide material. Therefore, if an appropriate electric signal is applied to the ReRAM, memory characteristics of the ReRAM change from one state, in which the ReRAM has a high resistance and is in a non-conductive state (i.e., an OFF state), to another state, in which the ReRAM has a low resistance and is in a conductive state (i.e., an ON state).

ReRAM characteristics are classified as a Current Controlled Negative Differential Resistance or a Voltage Controlled Negative Differential Resistance according to the method used to implement on/off characteristics.

Materials used in a ReRAM that result in ReRAM (MEMRISTOR) characteristics can be classified into the following first to fifth categories of materials, described below.

In the first category, a material having a Colossal Magneto-Resistance (CMR) property or a Pr1-xCaMnO3 (PCMO) material is inserted between electrodes so that it can utilize resistance variation caused by an electric field.

In the second category, a binary oxide material such as Nb2O5, TiO2, NiO, or Al2O3 is fabricated to have a non-stoichiometric composition so that the resultant binary oxide material can be used as a ReRAM material.

In accordance with the third category, a material serves as a chalcogenide material. A current as high as that in a PRAM does not flow in a chalcogenide material. As a result, a phase change is implemented, and an amorphous structure is maintained in such a manner that it is possible to utilize the difference in resistance caused by the difference in threshold voltage of an ovonic switch.

In accordance with the fourth category, chrome (Cr) or niobium (Nb) is doped on a material such as SrTiO3 or SrZrO3 so as to change a current resistance state to another resistance state.

In the fifth and final category, a Programmable Metallization Cell (PMC) having two resistance states is used. In more detail, silver (Ag) having high ion mobility is doped on GeSe by a solid electrolysis process and two resistance states are generated according to the presence or absence of a conductive channel in the medium obtained by an electrochemical reaction, resulting in a PMC.

However, besides these five categories of materials, other materials having memory characteristics acquired by implementation of stable two-resistance states or methods for fabricating such materials have recently been proposed.

FIG. 3 is a graph illustrating a current value that varies with time in a ReRAM utilizing an RSD.

Generally, ReRAM is configured to read data by sensing a current flowing through a resistor. However, the above-mentioned conventional ReRAM must read different resistance values when the ReRAM has a high resistance and when the ReRAM has a low resistance.

When a current flowing through a resistor is sensed, a constant voltage is applied to the ReRAM, and the ReRAM reads a current caused by the constant voltage. Alternatively, if a constant current is applied to a resistor, a voltage flowing through the ReRAM may be measured.

When the ReRAM is in a low resistance state, resistance of the ReRAM can be quickly detected. In contrast, when the ReRAM is in a high resistance state, it takes longer to detect resistance of the ReRAM. That is, when first data is read, a predetermined time is needed until a voltage level of a capacitor becomes constant. The predetermined time corresponds to the T1 section of FIG. 3. Thereafter, a voltage level may be increased or reduced in response to second data. In order to improve a sensing speed, a method for reducing the sensing time using an amplifier has been widely used.

However, if it is necessary for the ReRAM to read a high resistance value using either a dual sensing structure or a sensing operation, the sensing time T1 is increased. That is, when reading first data is read, a predetermined time is needed until a voltage level of a capacitor becomes constant. The predetermined time corresponds to the T1 section. Thereafter, a voltage level may be increased or reduced in response to second data.

BRIEF SUMMARY OF THE INVENTION

Various embodiments of the present invention are directed to providing a resistive Random Access memory (ReRAM) that substantially obviates one or more problems due to limitations and disadvantages of the related art.

An embodiment of the present invention relates to a resistive random access memory (ReRAM) configured to amplify electric charges through a second amplifier when a current detected by a first amplifier is stored in a capacitor, resulting in reduction in sensing time.

In accordance with an embodiment of the present invention, a resistive random access memory (ReRAM) device includes a first amplifier configured to amplify a sensing current corresponding to first data sensed in a memory cell; and a second amplifier configured to store the sensing current amplified by the first amplifier, and amplify the stored sensing current.

In accordance with an embodiment of the present invention, a resistive random access memory (ReRAM) device comprising: a first amplifying unit configured to receive an output from a resist memory; a first switching unit coupled between the resist memory and a first node and configured to operate in response to an output from the first amplifying unit; a second amplifying unit including an input terminal coupled to the first node and an output terminal coupled to a storage unit; and a second switching unit coupled between the storage unit and the first node and configured to operate in response to an output from the output terminal of the second amplifying unit.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
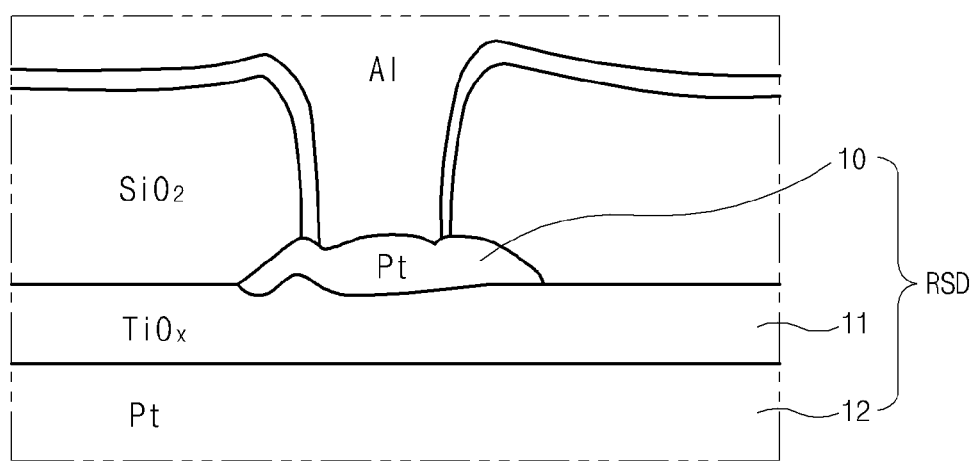
FIG. 1 is a cross-sectional view illustrating a resistive switch device (RSD) for use in a conventional ReRAM.
Figure 2:
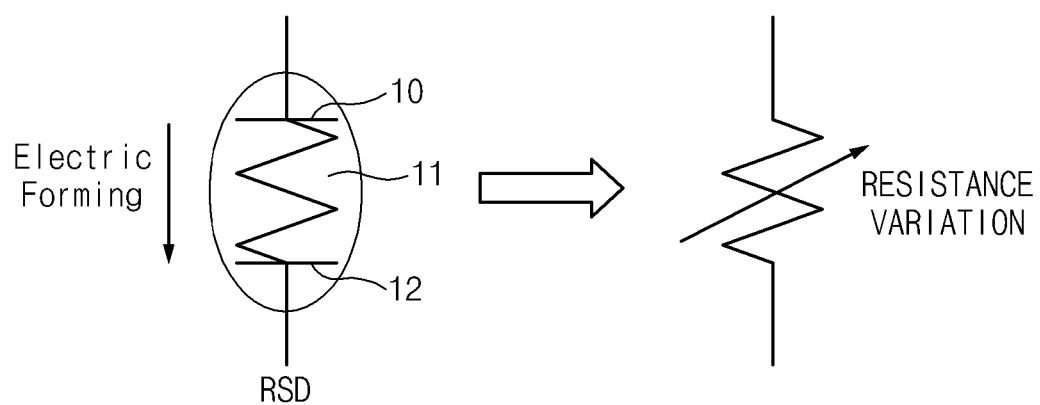
FIG. 2 illustrates principles of operations of the RSD of FIG. 1.
Figure 3:
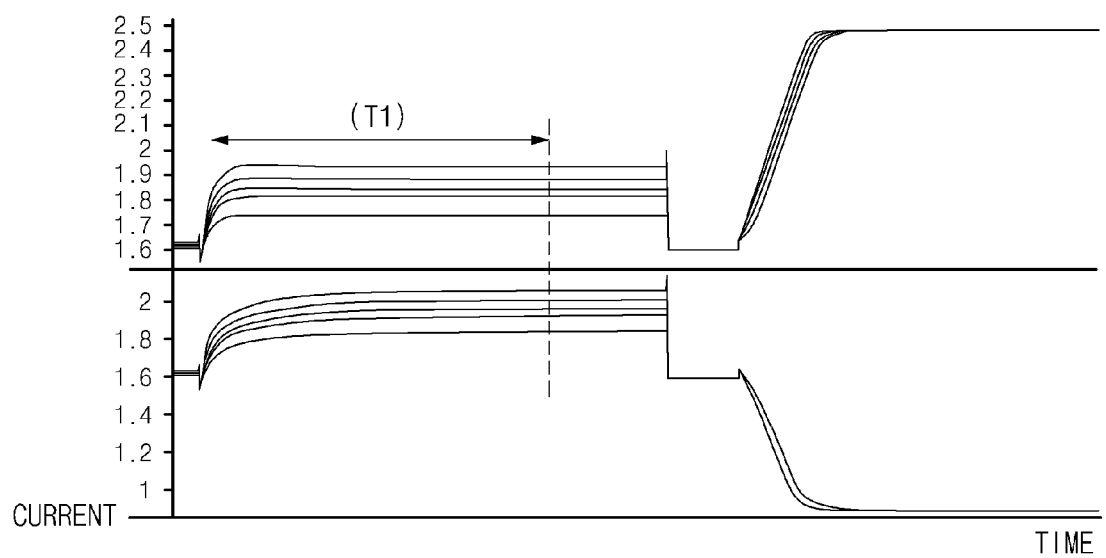
FIG. 3 is a graph illustrating a current value varying with time in a conventional ReRAM according to the related art.
Figure 4:
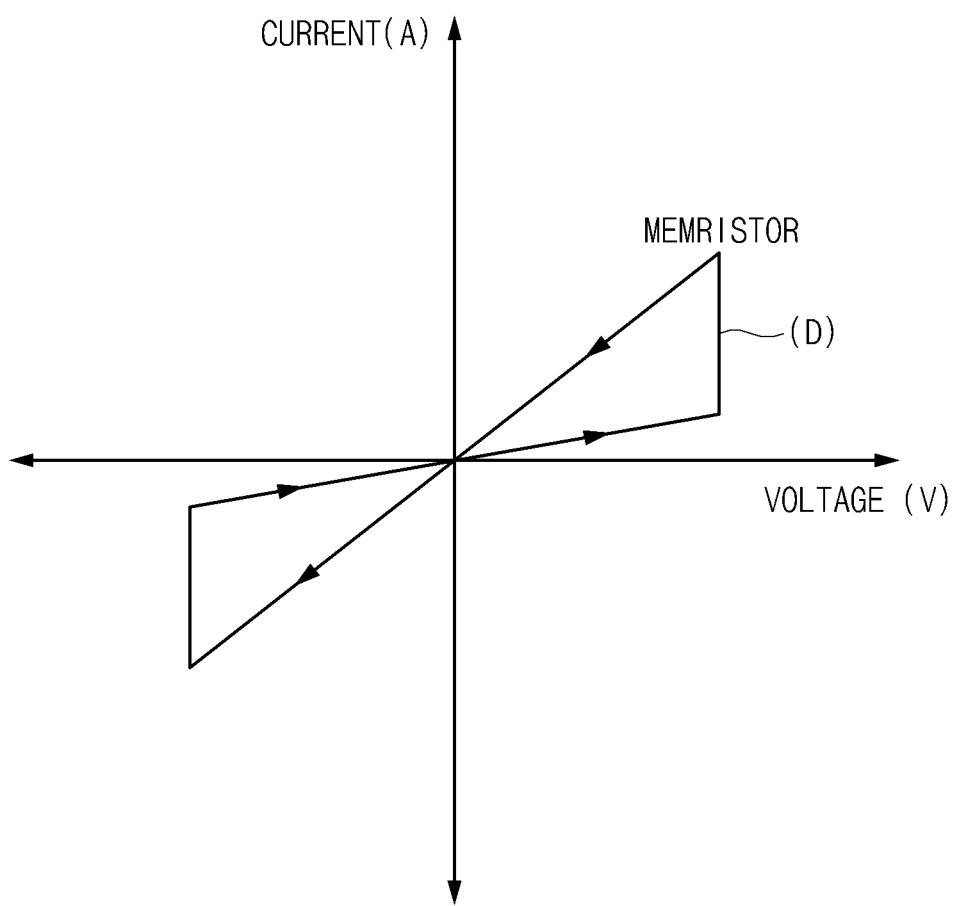
FIG. 4 illustrates MEMRISTOR characteristics according to an embodiment of the present invention.

FIG. 4 illustrates MEMRISTOR characteristics according to embodiments of the present invention.

Referring to FIG. 4, after first to third electronic circuit constituent elements (i.e., a resistor, a capacitor, and an inductor) are arranged, a MEMRISTOR, or a fourth electronic circuit constituent element, is then arranged. The term "MEMRISTOR" is an abbreviation for a memory resistor or a resistive memory.

The largest difference between the MEMRISTOR and other circuit elements is that the MEMRISTOR can store previous information as non-volatile information. That is, a resistance value of the MEMRISTOR is changed upon receiving a new flow of current, but the changed resistance value maintains unchanged until additional current is received.

The ReRAM is formed of a laminate structure of a first electrode, a transition metal oxide film, and a second electrode. The ReRAM is used as a non-volatile memory device. An external voltage is applied to the transition metal oxide film so as to change an electrical resistance of the transition metal oxide film. The difference in resistance is used for on/off operations.

Therefore, if a voltage applied between the first and the second electrodes increases in a positive (+) direction as shown in FIG. 4, a current increases with a predetermined slope. If a voltage is higher than a first threshold voltage, the current rapidly increases, as shown in (D) of FIG. 4.

Thereafter, if voltage decreases, current also decreases with a predetermined slope. In addition, if voltage decreases in a negative (−) direction, current also decreases with a predetermined slope. If voltage is equal to or less than a second threshold voltage, current rapidly increases. Subsequently, if voltage increases again, current increases with a predetermined slope.

That is, the ReRAM has MEMRISTOR characteristics due to the transition metal oxide film, such that a current rapidly increases or decreases repeatedly in response to a voltage.

Figure 5:
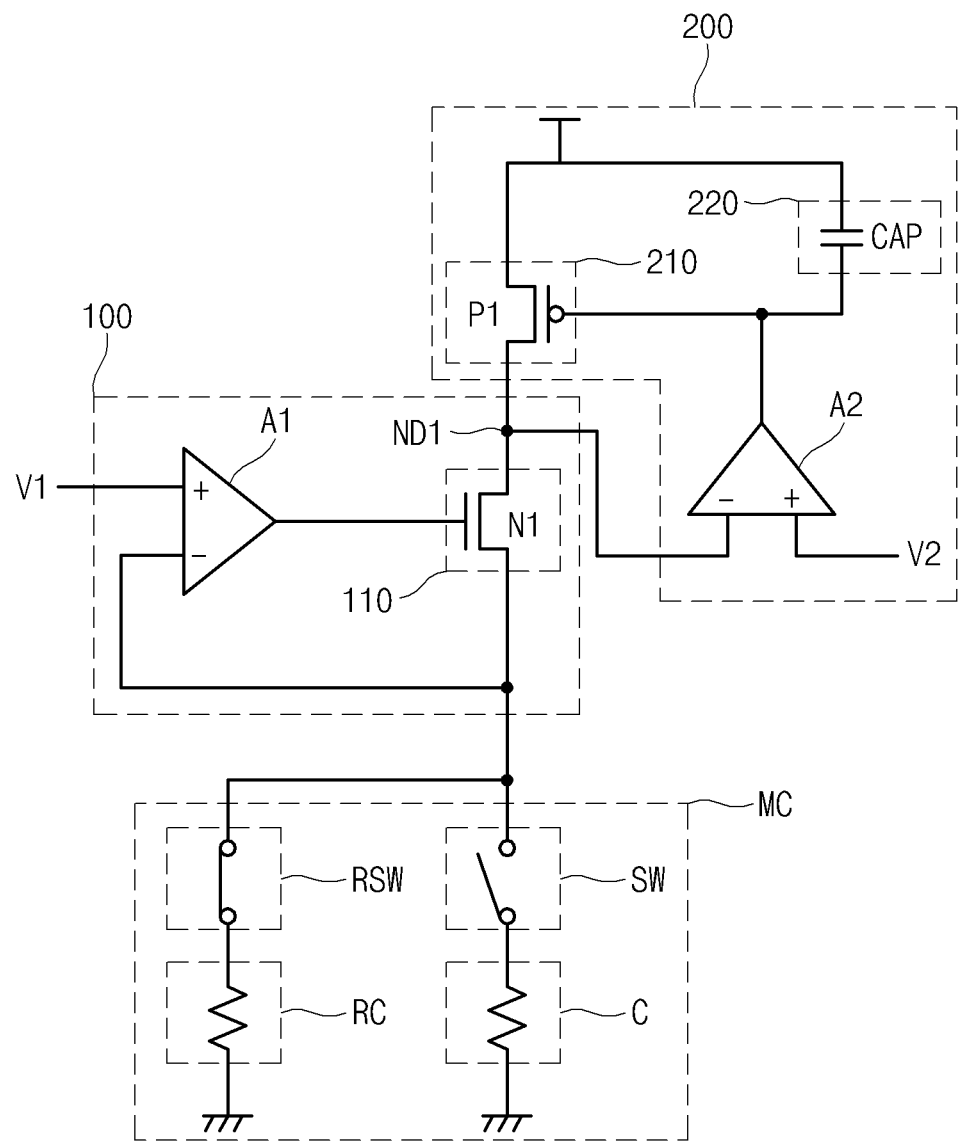
FIG. 5 is a circuit diagram illustrating a ReRAM device according to an embodiment of the present invention.

FIG. 5 is a circuit diagram illustrating a ReRAM device according to an embodiment of the present invention.

Referring to FIG. 5, the ReRAM device includes a memory cell MC, a first amplifier 100, and a second amplifier 200.

In this case, a memory cell (MC) includes a main cell (C), a reference cell (RC), a switching unit (SW), and a reference switching unit (RSW).

The first amplifier 100 includes an amplifying unit A1 and a switching unit 110.

A voltage (V1) is applied to a positive (+) terminal of the amplifying unit A1, and a sensing voltage detected by the memory cell (MC) is applied to a negative (−) terminal of the amplifying unit A1. The switching unit 110 includes an NMOS transistor N1. The NMOS transistor N1 is coupled between the negative (−) terminal of the amplifier A1 and a node (ND1), and a gate terminal of the NMOS transistor N1 is coupled to an output terminal of the amplifying unit A1.

In addition, the second amplifier 200 includes an amplifying unit A2, a switching unit 210, and a storage unit 220.

A voltage V2 is applied to a positive (+) terminal of the amplifying unit A2, and a voltage of the node (ND1) is applied to a negative (−) terminal of the amplifying unit A2. The switching unit 210 includes a PMOS transistor P1. The PMOS transistor P1 is coupled between a power-supply voltage unit and the node ND1, and a gate terminal of the PMOS transistor P1 is coupled to an output terminal of the amplifying unit A2. The storage unit 220 includes a capacitor (CAP) coupled between the power-supply voltage terminal and the output terminal of the amplifier A2.

Operations of the ReRAM according to an embodiment of the present invention will hereinafter be described in detail.

A sensing voltage (or current) detected by the memory cell (MC) is primarily amplified by the first amplifier 100, and is then secondarily amplified by the second amplifier 200, so that the total sensing time can be reduced.

That is, the sensing voltage detected by the main cell (C) is output to the first amplifier 100 through the switching unit SW. Alternatively, the voltage detected by a reference cell (RC) is output to the first amplifier 100 through the reference switching unit (RSW).

Thereafter, the amplifying unit A1 compares the voltage (V1) with the sensing voltage detected by the memory cell (MC), and amplifies the result of the comparison.

If the sensing voltage detected by the memory cell (MC) is equal to or higher than the voltage (V1), the amplifying unit A1 outputs a logic high level. In contrast, if the sensing voltage detected by the memory cell (MC) is less than the voltage (V1), the amplifying unit A1 outputs a logic low level.

If the output signal of the amplifying unit A1 is at a logic high level, an NMOS transistor N1 is turned on so that it can output the sensing voltage to the node (ND1). In contrast, if the output signal of the amplifier A1 is at a logic low level, the NMOS transistor N1 is turned off.

Subsequently, the amplifying unit A2 compares the voltage (V2) with the output voltage of the node (ND1), and amplifies the result of comparison.

For example, if the output voltage from the node (ND1) is higher than the voltage V2, the amplifying unit A2 outputs a logic high level. The output voltage from the amplifying unit A2 is stored in the capacitor CAP, so that the value of electric charges stored in the capacitor CAP can be amplified. A voltage (or current) level flowing in the PMOS transistor P1 is determined by a voltage level stored in the capacitor CAP in the same manner as in the operation for storing a voltage (or a current) in the capacitor CAP.

In an embodiment, if the output signal of the amplifying unit A2 is at a logic high level, the PMOS transistor P1 remains off.

On the other hand, if the output voltage from the node ND1 is less than the voltage V2, the amplifying unit A2 outputs a logic low level. If the amplifying unit A2 outputs a logic low level, the PMOS transistor P2 is turned on so that a current starts to flow in the node ND1.

Subsequently, a second current sensing operation is performed through the memory cell (MC), and the second current sensing operation can be transferred to the node ND1 through the first amplifier 100.

In an embodiment, if the second sensed current is higher than the current flowing in the PMOS transistor P1, a voltage of the node ND1 is reduced. On the other hand, if the second sensed current is less than the current flowing in the PMOS transistor P1, a voltage of the node ND1 is increased.

Figure 6:
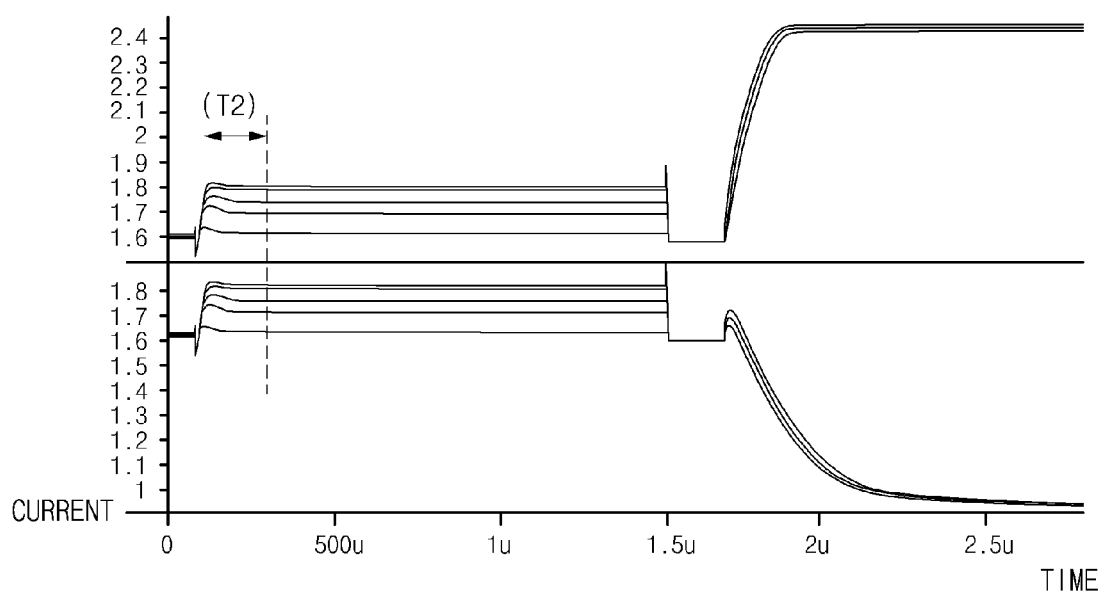
FIG. 6 is a graph illustrating a current value varying with time in a ReRAM according to an embodiment of the present invention.

Since the ReRAM must read a high resistance value during the sensing operation, the sensing time may be increased. The sensing time is determined by resistor and capacitor characteristics. Thus, in accordance with the present invention, capacitance caused by the capacitor CAP and resistance caused by the PMOS transistor P1 are adjusted to reduce the sensing time T2, as shown in FIG. 6.

That is, the ReRAM may read data two times using the same sense-amplifier. First data is read and stored in the storage unit 220. When reading second data, the second data is compared with the previous data, that is the first data stored in the storage node unit 220, so that the comparison result can be recognized.

When reading the first data, a predetermined time is needed until a voltage level of the capacitor CAP becomes constant. In brief, the predetermined time corresponding to the T2 section of FIG. 6 is required. Thereafter, a voltage level may increase or decrease in response to the second data as shown in FIG. 6.

Although it takes time for the first data sensed by the first amplifier 100 to be stored in the storage unit 220, the ReRAM according to the embodiment of the present invention can reduce an overall sensing time by executing a subsequent sensing operation through the amplifying unit A2. In other words, the output voltage from the amplifying unit A2 is stored in the capacitor CAP, so that a time for charging the storage unit 220 can be greatly reduced.

As is apparent from the above description, a current of a non-volatile memory device requires no refresh operation, whereas a current of a volatile memory such as DRAM does. Therefore, although large-capacity products are manufactured, the amount of a current necessary to operate the products is not significantly increased. Therefore, by reducing the sensing time according to embodiments of the present invention, development of large-capacity products may be possible.

As described above, the present invention can reduce the sensing time of the ReRAM, thus improving product performance.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A resistive random access memory (ReRAM) device comprising:
   a first amplifier configured to amplify a sensing current corresponding to first data sensed in a memory cell; and
   a second amplifier configured to store the sensing current amplified by the first amplifier, and amplify the stored sensing current.

2. The resistive random access memory (ReRAM) device according to claim 1,
   wherein the second amplifier includes:
   a storage unit configured to store the amplified sensing current;
   a switching unit coupled between a power-supply voltage input terminal and an output terminal of the first amplifier and configured to be controlled by electric charges of the storage unit; and
   an amplifying unit configured to compare a voltage of the output terminal of the first amplifier with a reference voltage, amplify the comparison result, and output the amplified result to the storage unit.

3. The resistive random access memory (ReRAM) device according to claim 2,
   wherein the storage unit includes a capacitor coupled between the power-supply voltage input terminal and an output terminal of the amplifying unit.

4. The resistive random access memory (ReRAM) device according to claim 2,
   wherein the switching unit includes a transistor coupled between the power-supply voltage input terminal and the output terminal of the first amplifier, and wherein a gate terminal of the transistor is coupled to the storage unit and an output terminal of the amplifying unit.

5. The resistive random access memory (ReRAM) device according to claim 4, wherein the transistor is a PMOS transistor.

6. The resistive random access memory (ReRAM) device according to claim 4, wherein the output terminal of the amplifying unit is coupled to the storage unit and the gate terminal of the transistor.

7. The resistive random access memory (ReRAM) device according to claim 2, wherein the storage unit is configured to store the first data that is read by the memory cell.

8. The resistive random access memory (ReRAM) device according to claim 1, wherein the memory cell includes a resistive memory (MEMRISTOR).

9. The resistive random access memory (ReRAM) device according to claim 2, wherein the amplifying unit is configured to amplify the stored sensing current in the storage unit when the voltage from the output terminal of the first amplifier is equal to or higher than the reference voltage.

10. The resistive random access memory (ReRAM) device according to claim 9, wherein the switching unit is configured to maintain an off state when the voltage from the output terminal of the first amplifier is equal to or higher than the reference voltage.

11. The resistive random access memory (ReRAM) device according to claim 2, wherein the switching unit is turned on when the voltage from the output terminal of the first amplifier is lower than the reference voltage, so that a current from the output terminal of the first amplifier is adjusted.

12. The resistive random access memory (ReRAM) device according to claim 2, wherein the voltage from the output terminal of the first amplifier is reduced when a current of second data read through the memory cell is higher than a current flowing in the switching unit.

13. The resistive random access memory (ReRAM) device according to claim 2, wherein the voltage from the output terminal is increased when a current of second data read through the memory cell is lower than a current flowing in the switching unit.

14. The resistive random access memory (ReRAM) device according to claim 1, wherein the second amplifier is configured to perform the amplification operation after completion of the amplification operation of the first amplifier.

15. A resistive random access memory (ReRAM) device comprising:
a first amplifying unit configured to receive an output from a resist memory;
a first switching unit coupled between the resist memory and a first node and configured to operate in response to an output from the first amplifying unit;
a second amplifying unit including an input terminal coupled to the first node and an output terminal coupled to a storage unit; and
a second switching unit coupled between the storage unit and the first node and configured to operate in response to an output from the output terminal of the second amplifying unit.

16. The resistive random access memory (ReRAM) device of claim 15,
wherein the second switching unit is configured to be in an off state when an output voltage from the first amplifier is equal to or higher than a reference voltage so that data stored in the storage unit is maintained, and
wherein the second switching unit is configured to be in an on state when the output voltage from the first amplifier is lower than the reference voltage, so that data stored in the storage unit is.

* * * * *